United States Patent
Kozuka

(10) Patent No.: US 12,266,502 B2
(45) Date of Patent: Apr. 1, 2025

(54) SAMPLE MILLING APPARATUS AND METHOD OF ADJUSTMENT THEREFOR

(71) Applicant: JEOL Ltd., Tokyo (JP)

(72) Inventor: Munehiro Kozuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 587 days.

(21) Appl. No.: 17/683,538

(22) Filed: Mar. 1, 2022

(65) Prior Publication Data

US 2022/0285125 A1   Sep. 8, 2022

(30) Foreign Application Priority Data

Mar. 8, 2021   (JP) .................. 2021-036229

(51) Int. Cl.
*H01J 37/304* (2006.01)
*H01J 37/20* (2006.01)
*H01J 37/31* (2006.01)

(52) U.S. Cl.
CPC ............ *H01J 37/304* (2013.01); *H01J 37/20* (2013.01); *H01J 37/31* (2013.01)

(58) Field of Classification Search
CPC .......... H01J 37/304; H01J 37/20; H01J 37/31; H01J 37/3005; H01J 2237/3151; G01N 1/286; G01N 1/32
See application file for complete search history.

(56) References Cited

U.S. PATENT DOCUMENTS

| | | | | |
|---|---|---|---|---|
| 8,542,275 B2* | 9/2013 | Kiyohara | ........... | G01N 23/2255 348/80 |
| 8,916,839 B2* | 12/2014 | Suzuki | ...................... | G01N 1/32 250/307 |
| 11,837,437 B2* | 12/2023 | Kimura | ................. | H01J 37/222 |
| 2005/0118065 A1* | 6/2005 | Hasegawa | ............. | H01J 37/305 422/502 |
| 2011/0063431 A1* | 3/2011 | Kiyohara | ........... | G01N 23/2255 382/145 |
| 2018/0240641 A1* | 8/2018 | Mikami | .................. | H01J 37/24 |
| 2022/0285125 A1* | 9/2022 | Kozuka | .................. | G01N 1/286 |

(Continued)

FOREIGN PATENT DOCUMENTS

JP      200591094 A    4/2005
WO    2017033591 A1   3/2017

OTHER PUBLICATIONS

Office Action issued in JP2021036229 on Mar. 7, 2023.

*Primary Examiner* — David A Vanore
(74) *Attorney, Agent, or Firm* — The Webb Law Firm

(57) ABSTRACT

A sample milling apparatus includes an ion source, a swinging mechanism for swinging a sample, a positioning camera for bringing a target milling position on the sample into coincidence with the impact point of an ion beam, and a display section for displaying an image captured by the positioning camera. The adjustment method starts with observing the trace of the impinging ion beam left on the sample with the positioning camera while the position of the positioning camera is held relative to the swing axis of the swinging mechanism and capturing an observation image. Then, a display image to be displayed on the display section is extracted from the observation image based on the position of the trace, thus bringing the beam impact point and the position of the field of view of the display image into coincidence.

14 Claims, 15 Drawing Sheets

(56) References Cited

U.S. PATENT DOCUMENTS

| | | | | |
|---|---|---|---|---|
| 2022/0392739 A1* | 12/2022 | Kozuka | ................... | H01J 37/09 |
| 2022/0392744 A1* | 12/2022 | Kimura | .................. | G01N 1/286 |
| 2023/0015109 A1* | 1/2023 | Kimura | ............... | H01J 37/3053 |
| 2023/0197401 A1* | 6/2023 | Kozuka | ................. | H01J 37/305 |
| | | | | 250/396 R |

* cited by examiner

SAMPLE MILLING APPARATUS AND METHOD OF ADJUSTMENT THEREFOR

CROSS REFERENCE TO RELATED APPLICATION

This application claims priority to Japanese Patent Application No. 2021-036229 filed Mar. 8, 2021, the disclosure of which is hereby incorporated by reference in its entirety.

BACKGROUND OF THE INVENTION

1. Field of the Invention

The present invention relates to a sample milling apparatus and a method of adjusting it.

2. Description of the Related Art

Cross Section Polisher (a trademark registered) for milling sample cross sections and Ion Slicer (a trademark registered) for preparing thin film samples are known as apparatus for milling samples using an ion beam. Such a sample milling apparatus is disclosed, for example, in JP-A-2005-91094.

With such a sample milling apparatus, prior to milling, the position of a positioning camera is adjusted such that the field of view of the positioning camera is brought into coincidence with the impact point of the ion beam.

An adjustment of the positioning camera is carried out, for example, as follows. First, a test sample is set on a sample stage of a sample milling apparatus and an impact point of the ion beam is determined. As an example, a silicon wafer having an oxide film thereon can be used as the test sample.

Then, the sample chamber is evacuated to a vacuum and the test sample is illuminated with an ion beam. This results in a trace of the impinging ion beam on the test sample.

The positioning camera is then set in position and the trace of the impinging beam is observed. The position of the positioning camera is mechanically adjusted so that the trace of the impinging beam coincides with the center of the field of view of the positioning camera, thus bringing the center of the field of view of the positioning camera and the beam impact point into coincidence with each other. Finally, the test sample is taken out of the sample stage. Because of the processing steps, an adjustment of the positioning camera can be accomplished.

After the adjustment of the positioning camera, a sample is set on the sample stage. The position of the sample is adjusted such that a target milling position on the sample agrees with the center of the field of view of the positioning camera. As a result, the ion beam can be directed at the target milling position on the sample.

In the sample milling apparatus, in order to reduce topography generated on the milled cross section through the sample, the sample is illuminated with an ion beam while swinging the sample to and fro. In this sample milling apparatus, if the distance between the swing axis and the beam impact point exceeds a tolerable range, the milling position may deviate from the field of view of the observation camera used to observe the sample being milled, in which case it is impossible to precisely judge the timing at which the milling is ended.

If the aforementioned adjustment of the positioning camera is performed, its position moves and so it is impossible to trace the position of the swing axis. Consequently, it is impossible to make a decision as to whether the distance between the swing axis and the beam impact point is excess of the tolerable range.

SUMMARY OF THE INVENTION

One aspect of the method of adjustment associated with the present invention is for use in a sample milling apparatus which includes: an ion source for emitting an ion beam at a sample such that a trace of the impinging ion beam is left on the sample; a swinging mechanism having a swing axis and operative to swing the sample; a positioning camera for bringing a target milling position on the sample into coincidence with a beam impact point on the sample; and a display section for displaying an image captured by the positioning camera. The method of adjustment comprises the steps of: observing the trace of the impinging beam left on the sample with the positioning camera while the positioning camera is positionally held relative to the swing axis of the swinging mechanism and obtaining an observation image; and extracting a display image to be displayed on the display section from the observation image based on the position of the trace of the impinging beam to thereby bring the impact point of the ion beam and the position of a field of view of the display image into coincidence with each other.

In this method of adjustment for a sample milling apparatus, if the impact point of the ion beam and the position of the field of view of the display image are brought into coincidence, the positional relationship between the field of view of the observation image from the positioning camera and the swing axis does not vary. Therefore, the position of the swing axis can be easily identified. Consequently, it is easy to make a decision as to whether the distance between the swing axis and the impact point of the ion beam is in excess of the tolerable range.

One aspect of the sample milling apparatus associated with the present invention includes: an ion source for emitting an ion beam at a sample; a swinging mechanism having an swing axis and operative to swing the sample; a positioning camera for bringing a target milling position on the sample into coincidence with an impact point of the ion beam; a display section for displaying an observation image captured by the positioning camera; and a display controller for extracting a display image from the observation image captured by the positioning camera and displaying the display image on the display section. The display controller modifies the field of view of the display image by modifying the position at which the display image is extracted from the observation image.

In this sample milling apparatus, the field of view of the display image can be varied by varying the position at which the display image is extracted from the observation image and, therefore, if the impact point of the ion beam and the position of the field of view of the display image are brought into coincidence, the positional relationship between the field of view of the observation image from the positioning camera and the swing axis does not vary. This facilitates identifying the position of the swing axis. Accordingly, it is easy to make a decision as to whether the distance between the swing axis and the impact point of the ion beam exceeds a tolerable range.

DESCRIPTION OF THE INVENTION

The preferred embodiments of the present invention are hereinafter described in detail with reference to the drawings. Note that the embodiments provided below are not intended to unduly restrict the contents of the present invention delineated by the claims and that not all the configurations set forth below are essential constituents of the present invention.

1. Sample Milling Apparatus

Figure 1:
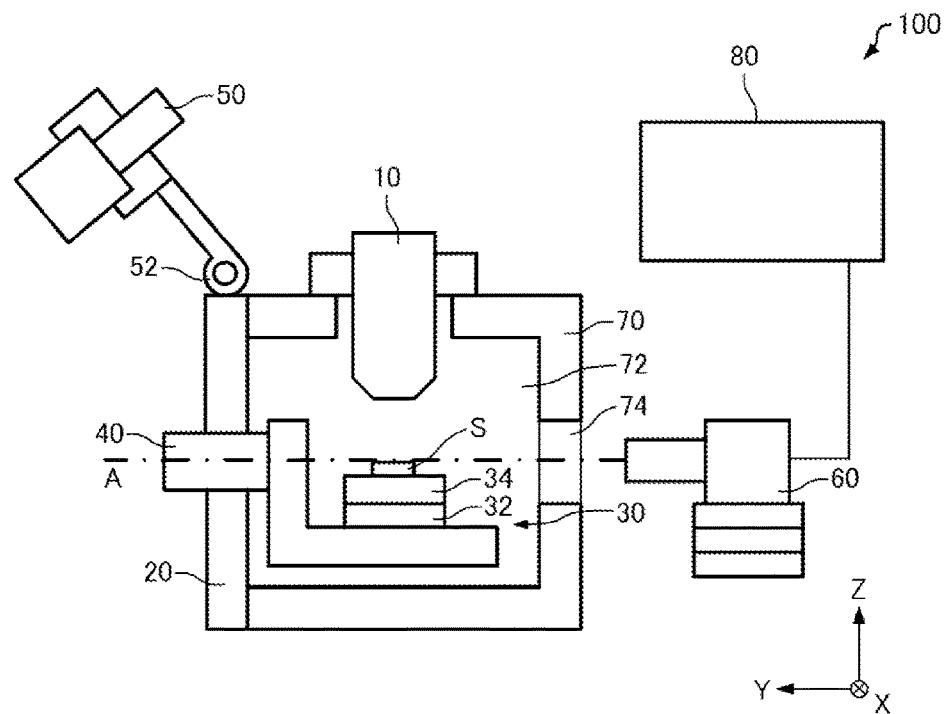
FIGS. 1 and 2 are diagrams showing the configuration of a sample milling apparatus, illustrating different operational states.
Figure 2:
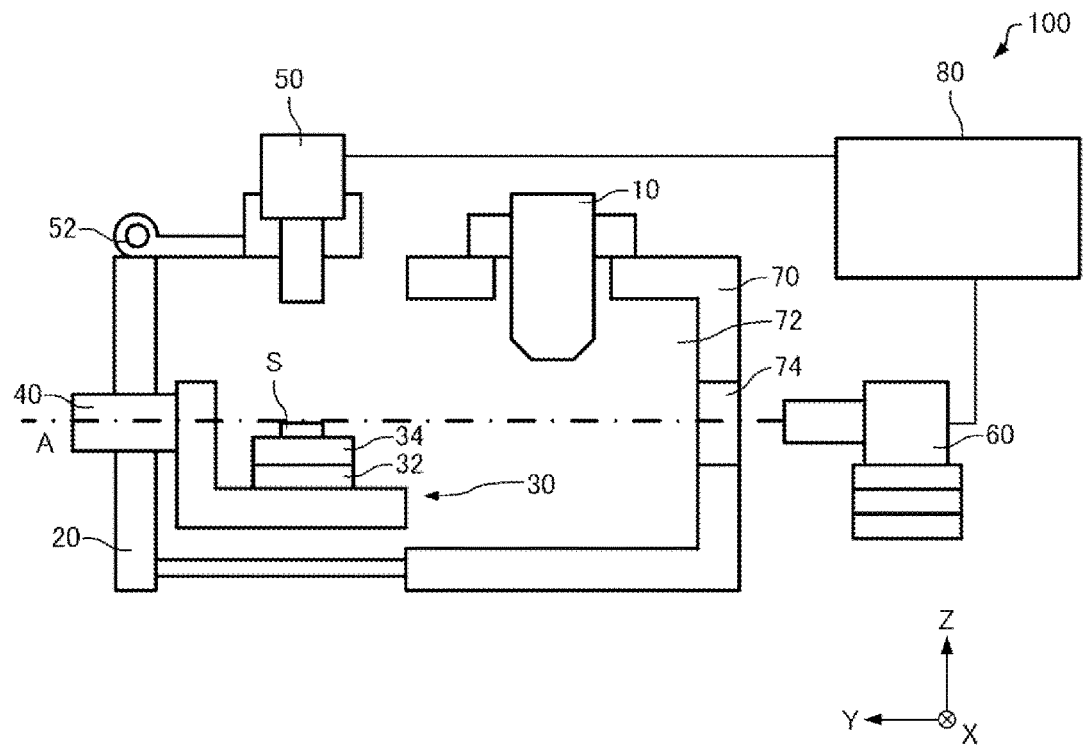

A method associated with one embodiment of the present invention for adjusting a sample milling apparatus is described. This sample milling apparatus is first described by referring to FIGS. 1 and 2 in the following. FIGS. 1 and 2 show the configuration of the sample milling apparatus, 100, to be adjusted by the method associated with the present embodiment.

In FIGS. 1 and 2, X-, Y-, and Z-axes are shown as three axes perpendicular to each other.

The sample milling apparatus 100 is an ion milling apparatus which emits an ion beam at a sample S, mills it, and prepares a specimen used for observation or analysis. The sample milling apparatus 100 is the Cross Section Polisher (a trademark registered) for milling a cross section through a sample, for example.

The sample milling apparatus 100 is used for preparation of specimens for electron microscopes such as scanning electron microscopes (SEMs), transmission electron microscopes (TEMs), and scanning transmission electron microscopes (STEMs). Furthermore, the sample milling apparatus 100 is used for preparation of specimens for electron probe microanalyzers (EPMAs) and Auger microprobes.

As also shown in FIGS. 1 and 2, the sample milling apparatus 100 includes an ion source 10, a sample stage pull-out mechanism 20, a sample stage 30, a swinging mechanism 40, a positioning camera 50, a milling observation camera 60, a chamber housing 70 defining a sample chamber 72, and an image processor 80. FIG. 2 shows an operational state in which the sample stage pull-out mechanism 20 has been opened or stretched to extract the sample stage 30 from the sample chamber 72. FIG. 1 shows an operational state in which the sample stage pull-out mechanism 20 has been closed or compressed to push the sample stage 30 into the sample chamber 72.

The ion source 10 produces and emits an ion beam at the sample S. The ion source 10 is mounted at the top of the chamber housing 70. The ion source 10 is an ion gun, for example. The ion source 10 emits the ion beam by accelerating it with a given acceleration voltage. For example, an Ar ion beam can be used as the ion beam. The diameter of the ion beam is on the order of hundreds of micrometers, for example.

The sample stage pull-out mechanism 20 is mounted to the chamber housing 70 so as to be opened and closed. The pull-out mechanism 20 constitutes a cover over the chamber housing 70. The sample stage 30 is mounted to the sample stage pull-out mechanism 20. The sample stage 30 can be pulled out from the sample chamber 72 as shown in FIG. 2 by opening or stretching the stage pull-out mechanism 20. Consequently, the interior of the chamber housing 70, i.e., the sample chamber 72, can be opened to the atmosphere. Also, by opening the sample stage pull-out mechanism 20, the positioning camera 50 is placed over the sample S and so the sample S can be observed with the positioning camera 50.

The sample stage 30 can be pushed into the sample chamber 72 by closing the sample stage pull-out mechanism 20 as shown in FIG. 1. In consequence, the chamber housing 70 can be made airtight. Under this condition, the sample chamber 72 can be evacuated or depressurized by operating vacuum pumping equipment (not shown). By closing the sample stage pull-out mechanism 20, the ion source 10 is placed over the sample S and the sample S can be milled with the ion beam emitted from the ion source 10.

The sample stage 30 is mounted to the swinging mechanism 40. The sample stage 30 mechanically supports the sample S to be milled. The sample stage 30 has an X drive mechanism 32 and a Y drive mechanism 34 which are capable of moving the sample S along the X-axis and Y-axis, respectively. The X drive mechanism 32 and Y drive mechanism 34 permit the sample S to be moved horizontally in two dimensions. Hence, the sample S can be placed in position. The sample milling apparatus 100 is equipped with a beam shielding plate (not shown) for shielding the ion beam. The sample S is supported on the sample stage 30 and has portions protruding from the shielding plate. These protruding portions are sputtered.

The swinging mechanism 40 is mounted to the sample stage pull-out mechanism 20. By opening the pull-out mechanism 20, the swinging mechanism 40 is pulled out, and the sample stage 30 is also pulled out.

The swinging mechanism 40 tilts the sample stage 30 around a swing axis A (tilt axis). The swinging mechanism 40 swings the sample S by tilting the sample stage 30 around the swing axis A at regular cycles. In the illustrated example, the swing axis A is parallel to the Y-axis.

The positioning camera 50 is mounted at the upper end of the sample stage pull-out mechanism 20. For example, the positioning camera 50 is a camera attached to an optical microscope. That is, the image captured by the positioning camera 50 is an image observed with the optical microscope. The positioning camera 50 is used to bring a target milling position for the sample S into coincidence with the impact point of the ion beam. The observation image captured by the positioning camera 50 is sent to the image processor 80.

When the sample stage pull-out mechanism 20 is in its open state, the positioning camera 50 is placed at a position where it can observe the sample S. In this open state, the optical axis of the positioning camera 50 is parallel to the Z-axis. When the sample stage pull-out mechanism 20 is in its closed state, the positioning camera 50 is placed outside the sample chamber 72 by a camera tilting mechanism 52.

The milling observation camera 60 is disposed outside the sample chamber 72 and can observe the inside of the sample chamber 72 through an observation window 74 formed in the chamber housing 70. The optical axis of the milling observation camera 60 is parallel to the Y-axis. The image captured by the observation camera 60 is sent to the image processor 80.

The sample stage 30 is disposed within the chamber housing 70. As mentioned previously, the sample chamber 72 is an interior space of the chamber housing 70. In the sample chamber 72, the sample S is irradiated with an ion beam.

The image processor 80 performs processing such that the image captured by the positioning camera 50 is displayed on the display section. The image processor 80 extracts a part of the image captured by the positioning camera 50, creates a display image, and displays the created display image on the display section. Furthermore, the image processor 80 performs processing such that the image captured by the milling observation camera 60 is displayed on the display section.

Figure 3:
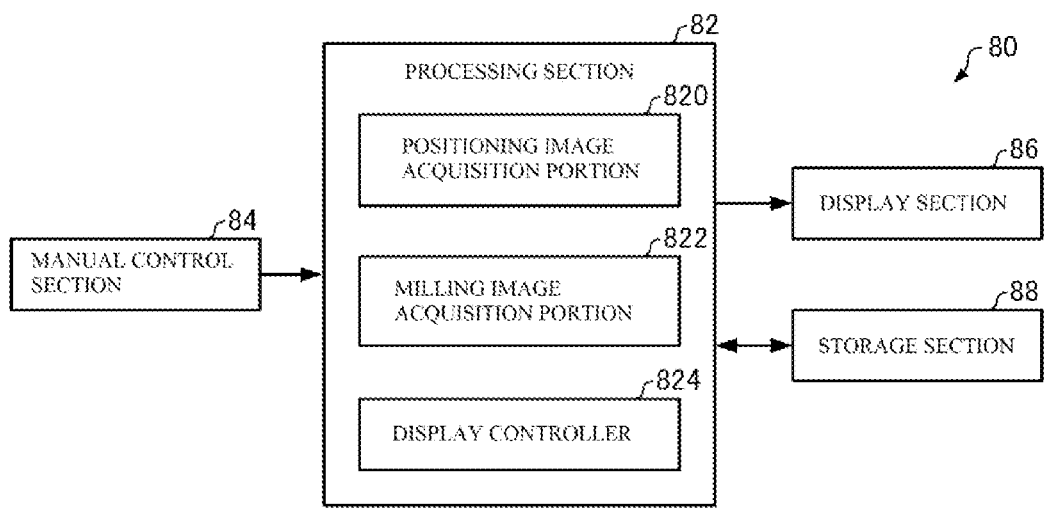
FIG. 3 is a block diagram illustrating the configuration of an image processor.

FIG. 3 illustrates the configuration of the image processor 80. The processor 80 includes a processing section 82, a manual control section 84, the above-described display section 86, and a storage section 88. The manual control section 84 permits a user to enter information about manipulations and to output the entered information to the processing section 82. The functions of the manual control section 84 can be realized by hardware devices such as a keyboard, a mouse, buttons, a touch panel, and a touch pad.

The display section 86 displays the image created by the processing section 82. The functions of the display section 86 can be accomplished by an LCD, a CRT, or a touch panel that functions also as the manual control section 84.

Computer programs and various kinds of data which permit a computer to function as various portions of the processing section 82 are stored in the storage section 88. The storage section 88 also functions as a working area for the processing section 82. The function of the storage section 88 can be realized by a hard disk, a RAM (random access memory), or the like.

The functions of the processing section 82 can be realized by executing computer programs using a hardware device such as any one of various processors (e.g., a CPU and a DSP). The processing section 82 includes a positioning image acquisition portion 820, a milling image acquisition portion 822, and a display controller 824.

The image acquisition portion 820 for positional coincidence acquires the image captured by the positioning camera 50 by receiving image data sent from the positioning camera 50.

The image acquisition portion 822 for acquiring an image used for milling obtains the image captured by the milling observation camera 60 by receiving image data sent from the milling observation camera 60.

The display controller 824 receives image data of the positioning camera 50 derived by the image acquisition portion 820 for positional coincidence, extracts a part of the observation image captured by the positioning camera 50, generates a display image, and displays the generated display image on the display section 86.

The positioning camera 50 is a higher pixel count camera and incorporates a low-magnification lens. Therefore, the positioning camera 50 can capture a wide field-of-view camera image at high resolution. Accordingly, the camera can extract a display image from the wide field-of-view observation image and hence obtain a high-resolution display image.

The display controller 824 receives the image data from the milling observation camera 60, the image data being derived by the milling image acquisition section 822, and displays the image captured by the milling observation camera 60 on the display section 86.

2. Method of Adjustment for Sample Milling Apparatus

In the sample milling apparatus 100, the position of the swing axis A is fixed. Also, in the state of FIG. 2 where the sample stage pull-out mechanism 20 is open, the position of the positioning camera 50 is fixed. The positioning camera 50 is held at a position where the swing axis A passes through the center of the field of view of the observation image from the positioning camera 50. Therefore, when the sample stage pull-out mechanism 20 is open, the field of view of the observation image from the positioning camera 50 is fixed. The swing axis A invariably passes through the center of the field of view of the observation image from the positioning camera 50.

In this way, the sample milling apparatus 100 is not equipped with any adjusting mechanism for adjusting the position of the positioning camera 50 relative to the impact point of the ion beam.

Accordingly, in the sample milling apparatus 100, when the sample stage pull-out mechanism 20 is open as shown in FIG. 2, the center of the field of view of the display image is so adjusted as to agree with the optical axis of the ion source 10 when the sample stage pull-out mechanism 20 is closed as shown in FIG. 1. Consequently, the target milling position can be brought into coincidence with the impact point of the ion beam by bringing the target milling position on the sample S into coincidence with the center of the field of view of the display image. The display image is created by extracting a part of the observation image from the positioning camera 50 using the display controller 824.

Figure 4:
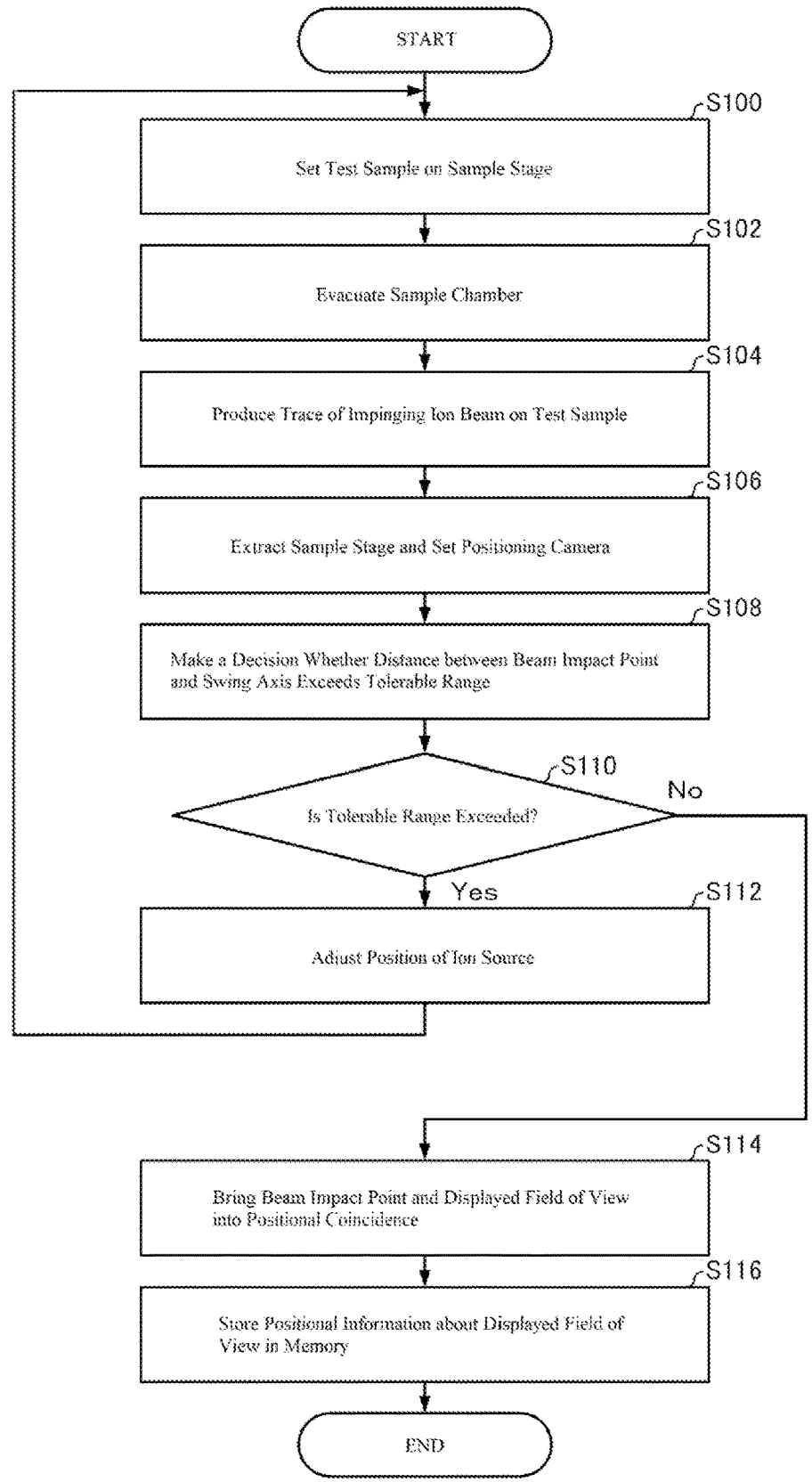
FIG. 4 is a flowchart illustrating one example of a method according to one embodiment of the present invention for adjusting a sample milling apparatus.

A method of adjustment for bringing the field of view of a display image into coincidence with the impact point of the ion beam is described in the following. FIG. 4 is a flowchart illustrating one example of the method of adjustment associated with the present embodiment for a sample milling apparatus. First, as shown in FIG. 2, the sample stage pull-out mechanism 20 is opened or stretched, a test sample is set on the sample stage 30, and an impact point of an ion beam on the sample is determined (S100). As an example, a silicon wafer having an oxide film thereon can be used as the test sample.

Then, the sample stage pull-out mechanism 20 is closed or compressed as shown in FIG. 1, the sample chamber 72 is hermetically sealed, and the sample chamber 72 is evacuated to a vacuum (S102).

Then, the test sample is irradiated with the ion beam to produce a trace of the impinging ion beam on the test sample (S104). Since the silicon wafer having the oxide film thereon is irradiated with the ion beam, the oxide film is removed, and the silicon is exposed. As a result, the trace of the impinging beam is left on the test sample.

Then, the sample chamber 72 is opened to the atmosphere. As shown in FIG. 2, the sample stage pull-out mechanism 20 is opened to pull out the sample stage 30, and the positioning camera 50 is set (S106). Consequently, the test sample can be observed with the positioning camera 50.

Figure 5:
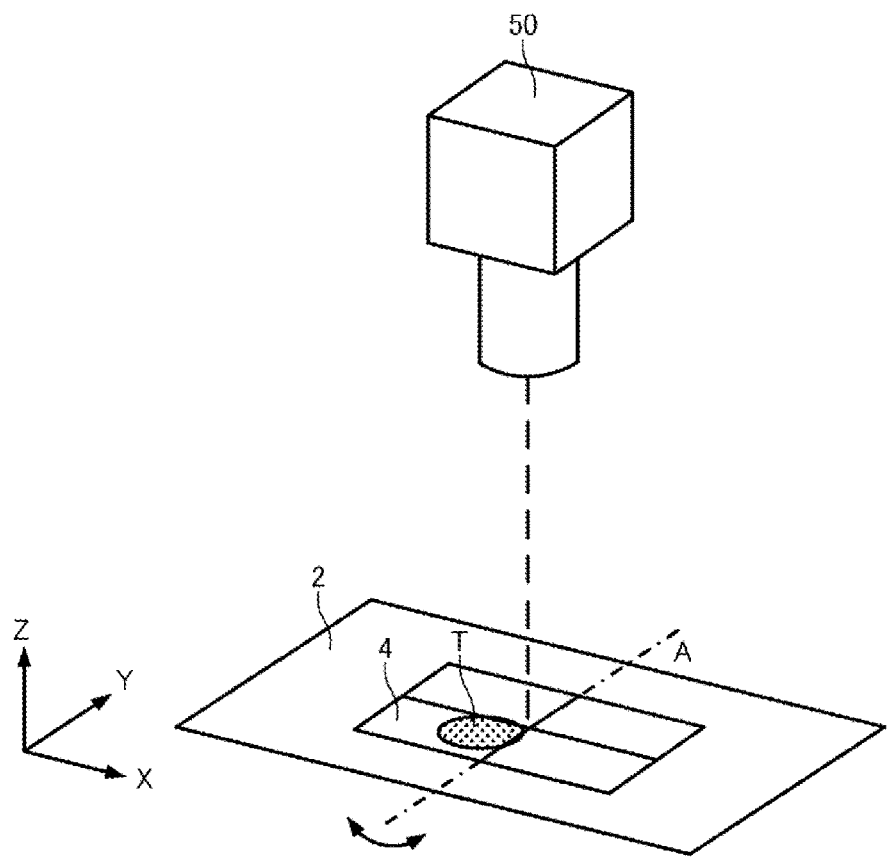
FIG. 5 is a diagram illustrating the manner in which a test sample is being observed by a positioning camera.
Figure 6:
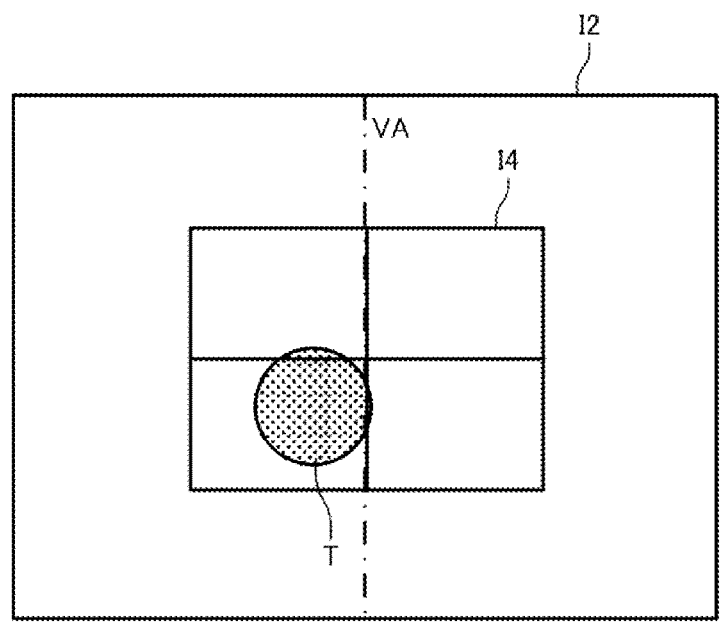
FIG. 6 illustrates an observation image and a display image.

FIG. 5 illustrates the manner in which the test sample is being observed with the positioning camera 50. FIG. 6 illustrates an observation image I2 from the positioning camera 50 and a display image I4. The observed field of view 2 shown in FIG. 5 is the field of view of the observation image I2 from the positioning camera 50. The displayed field of view 4 shown in FIG. 5 is the field of view of the display image I4 displayed on the display section 86.

The trace T of the impinging ion beam can be observed with the positioning camera 50 as shown in FIGS. 5 and 6 by opening the sample stage pull-out mechanism 20 and pulling out the sample stage 30. The positioning camera 50 captures the observation image I2 of the field of view 2 being observed. The display controller 824 extracts a part of the observation image I2, generates the display image I4, and displays it on the display section 86.

When the sample stage pull-out mechanism 20 has been opened, the positioning camera 50 is held in a position where the swing axis A of the positioning camera 50 passes through the center of the observed field of view 2 of the positioning camera 50. Therefore, the display controller 824 draws, on the observation image I2, a virtual swing axis VA passing through the center of the observed field of view 2 such that the virtual axis VA coincides with the swing axis A. On the display section 86, the virtual swing axis VA is superimposed on the display image I4. That is, the virtual swing axis VA is displayed over the display image I4. In this way, in the sample milling apparatus 100, the swing axis A is visualized.

Then, a decision is made as to whether the distance between the swing axis A and the impact point of the ion beam exceeds a tolerable range (S108). This distance between the swing axis A and the beam impact point is taken in a direction perpendicular to the swing axis A, i.e., in the X direction. In the sample milling apparatus 100, as shown in FIG. 6, the display image I4 and the virtual swing axis VA are displayed on the display section 86 and so the distance between the swing axis A and the beam impact point can be found by measuring the distance between the virtual swing axis VA and the trace T of the impinging beam T on the display image I4.

If the decision of step S110 is Yes, indicating that the distance between the swing axis A and the impact point of the ion beam exceeds the tolerable range, the position of the ion source 10 is so adjusted that the distance between the swing axis A and the impact point of the beam is within the tolerable range (S112). This adjustment is carried out by reassembling the ion source 10 or adjusting the position using a position-adjusting mechanism for the ion source 10.

After the adjustment of the position of the ion source 10, control returns to step S100, and steps S102, S104, S106, S108, S110, and S112 are performed. In this way, the steps S100, S102, S104, S106, S108, S110, and S112 are repeatedly performed until it is determined in step S110 that the distance between the swing axis A and the beam impact point does not exceed the tolerable range.

If the decision of step S110 is negative (No), indicating that the distance between the swing axis A and the impact point of the ion beam does not exceed the tolerable range, the impact point of the beam and the position of the displayed field of view 4 are brought into coincidence (S114).

Figure 7:
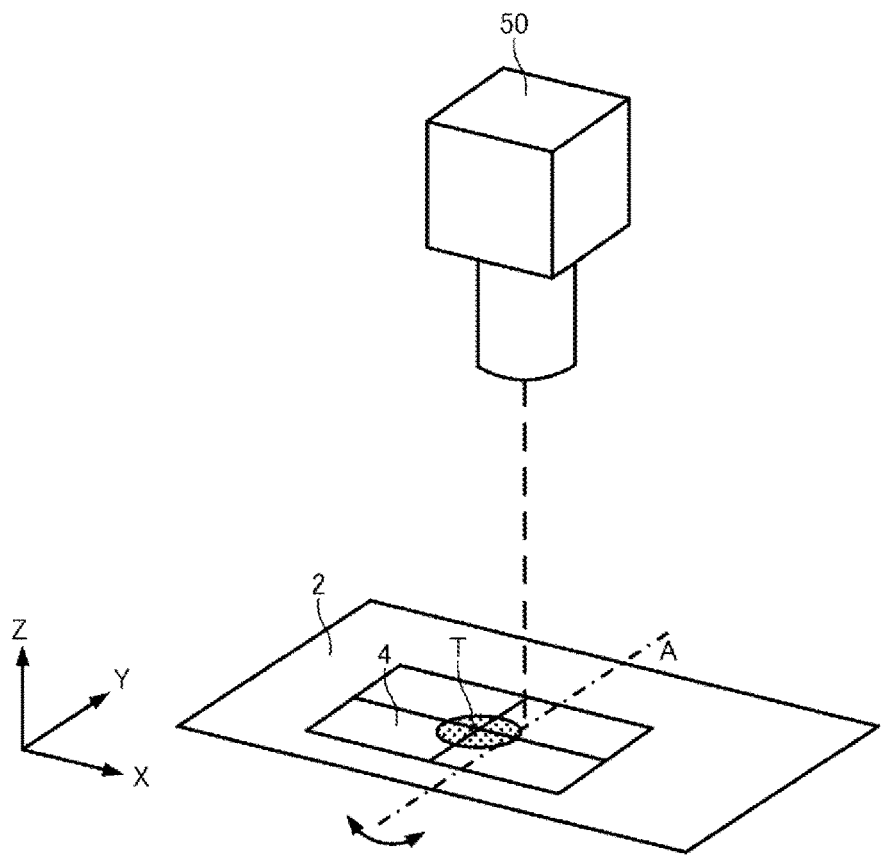
FIGS. 7 and 8 illustrate processing steps for bringing an impact point of an ion beam and the position of a displayed field of view into coincidence.
Figure 8:
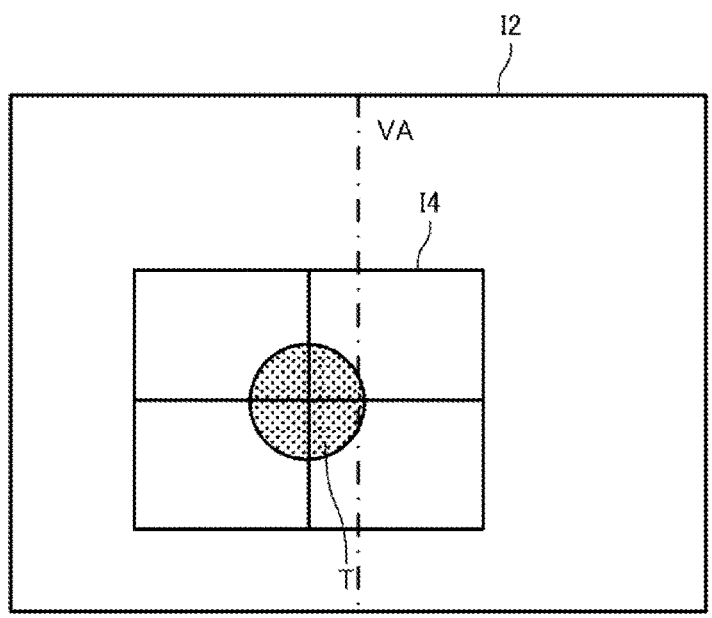

FIGS. 7 and 8 illustrate a step of bringing the impact point of the ion beam and the position of the displayed field of view 4 into coincidence. FIGS. 7 and 8 correspond to FIGS. 5 and 6, respectively.

In the present step, the displayed field of view 4 is modified such that the impact point of the ion beam and the center of the displayed field of view 4 coincide. In the sample milling apparatus 100, when the sample stage pull-out mechanism 20 has been stretched, the field of view 2 under observation of the positioning camera 50 is held fixed. Accordingly, the impact point of the ion beam and the position of the displayed field of view 4 are brought into coincidence by modifying the position at which the display image I4 is extracted from the observation image I2 captured by the positioning camera 50. In this example, the position at which the display image I4 is extracted from the observation image I2 is modified such that the beam impact point lies at the center of the displayed field of view 4. As a result, the center of the displayed field of view 4 and the impact point of the ion beam come into coincidence.

For example, if an instruction for modifying the displayed field of view 4 is entered via the manual control section 84, the display controller 824 extracts the display image I4 from the observation image I2 at a position complying with the instruction, and displays the display image I4 on the display section 86. Where the manual control section 84 is a touch panel, the instruction for modifying the displayed field of view 4 can be entered by performing a drag operation on the display image I4 such that the trace T of the impinging beam overlaps a marker indicative of the center of the displayed field of view 4.

In this way, the manual control section 84 accepts the manipulative action for modifying the displayed field of view 4 by altering the position at which the display image I4 is extracted from the observation image I2. The display controller 824 accepts manual control information from the manual control section 84, modifies the position at which the display image I4 is extracted from the observation image I2 based on the manual control information, generates the display image I4, and displays it on the display section 86.

Then, information about the position of the displayed field of view 4 is stored (S116). That is, information about the coordinates of the position at which the display image I4 is extracted on the observation image I2 is stored. The test sample is taken out of the sample stage 30. Because of the processing steps described so far, the sample milling apparatus 100 can be adjusted.

After the sample milling apparatus 100 is adjusted in this way, the target milling position for the sample is brought into coincidence with the impact point of the ion beam. In particular, the sample stage pull-out mechanism 20 is opened or stretched to pull out the sample stage 30 as shown in FIG. 2. A sample to be milled is then set on the sample stage 30. The sample stage 30 is adjusted in position such that the target milling position is located at the center of the displayed field of view 4. Then, the sample stage pull-out mechanism 20 is closed or compressed as shown in FIG. 1, and the sample chamber 72 is evacuated to a vacuum. An ion beam is emitted from the ion source 10. Consequently, the ion beam impinges at the target milling position.

In the foregoing description, the impact point of the ion beam and the center of the displayed field of view 4 are brought into coincidence. Alternatively, the beam impact point and an arbitrary position on the displayed field of view 4 may be brought into coincidence, in which case a method of adjustment can be implemented similarly to the above-described method of adjustment.

3. Effects

The method of adjustment associated with the present embodiment is for use in the sample milling apparatus which includes: the ion source 10; the swing mechanism 40 for swinging the sample S; the positioning camera 50 for bringing the target milling position on the sample S into coincidence with the impact point of the ion beam; and the display section 86 for displaying the image captured by the positioning camera 50. This method of adjustment involves the steps: observing the trace T of the impinging beam on the sample S with the positioning camera 50 while the positioning camera 50 is held in position relative to the swing axis A of the swinging mechanism 40 and obtaining the observation image I2; and bringing the impact point of the ion beam and the position of the field of view of the display image I4 into coincidence by extracting the display image I4 from the observation image I2 based on the position of the trace T of the impinging beam.

In this method of adjustment for the sample milling apparatus 100, if the impact point of the ion beam and the position of the field of view of the display image I4 are brought into coincidence, the positional relationship between the observed field of view 2 of the positioning camera 50 and the swing axis A does not vary. Therefore, within the field of view 2 under observation, the position of the swing axis A can be identified easily. Consequently, it is easy to make a decision as to whether the distance between the swing axis A and the impact point of the ion beam exceeds the tolerable range.

Figure 9:
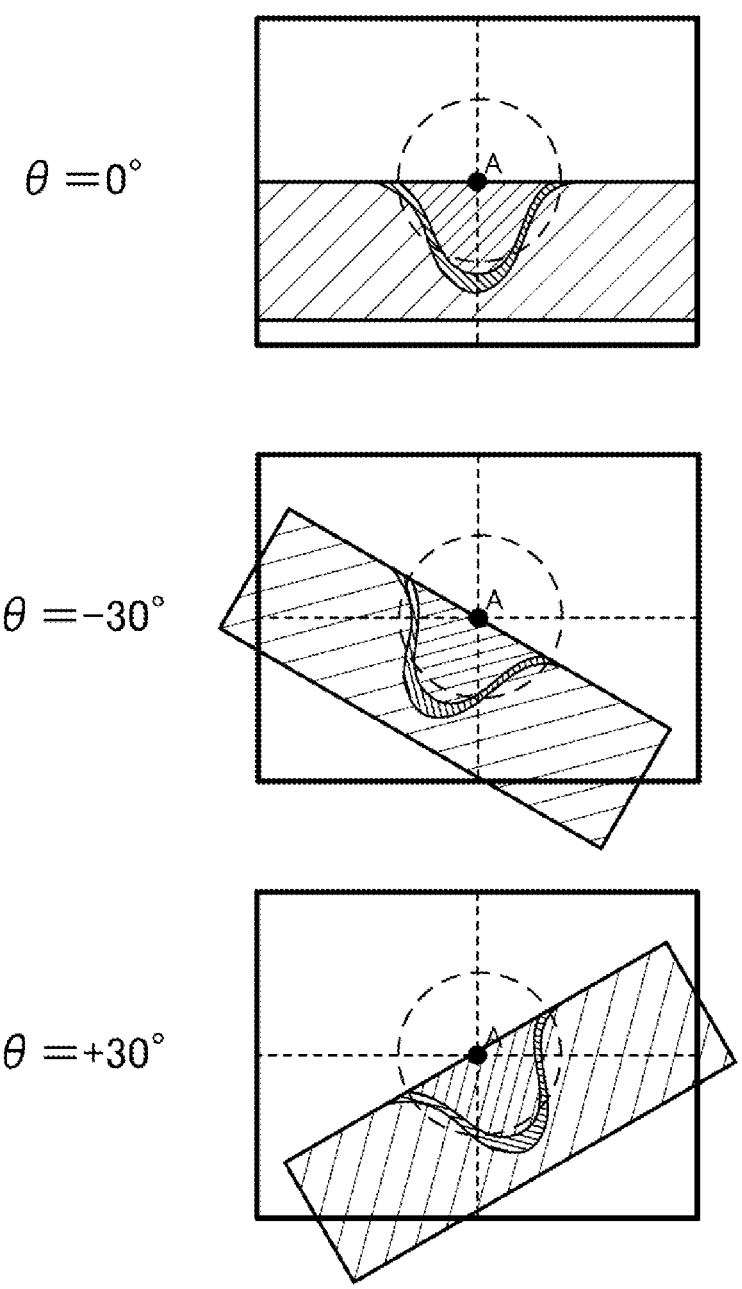
FIG. 9 shows observation images from a milling observation camera when the swing axis and the beam impact point are coincident.
Figure 10:
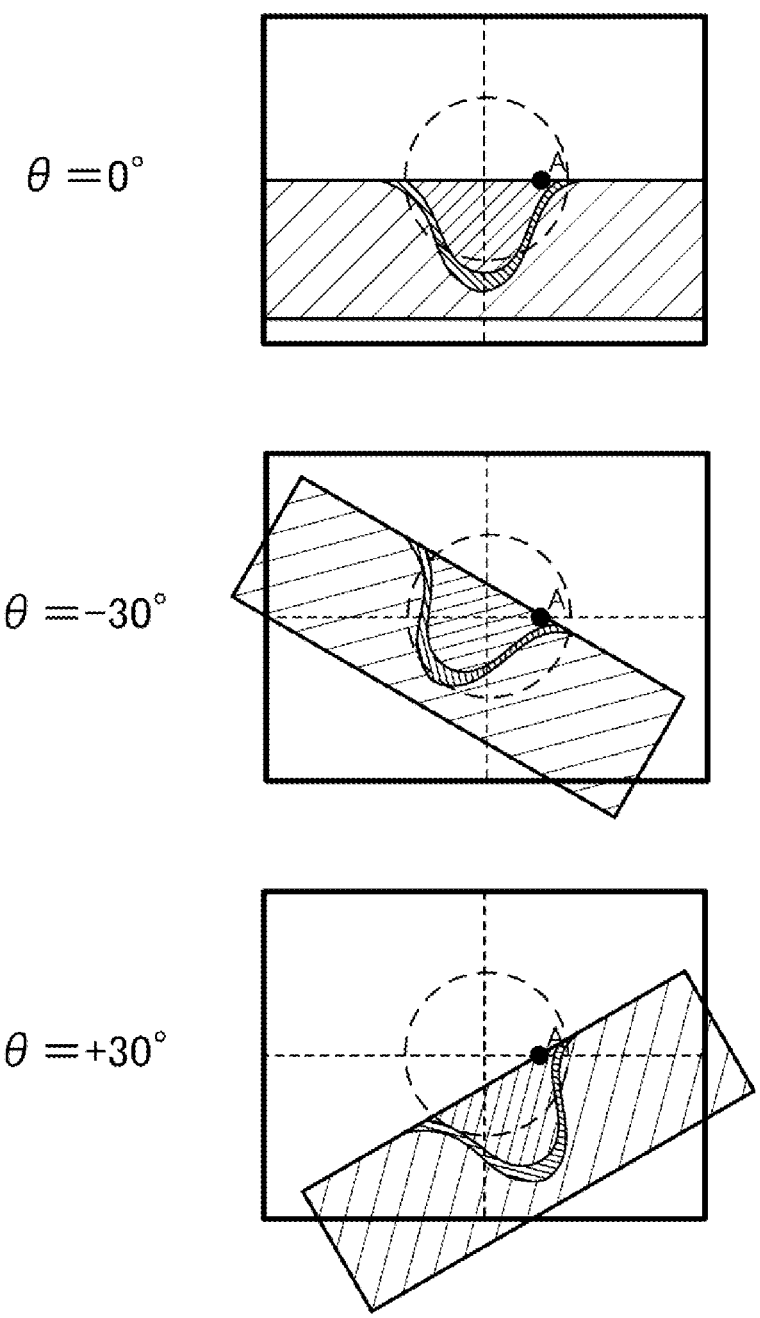
FIG. 10 shows images from the milling observation camera when the swing axis and the beam impact point are not coincident.
Figure 11:
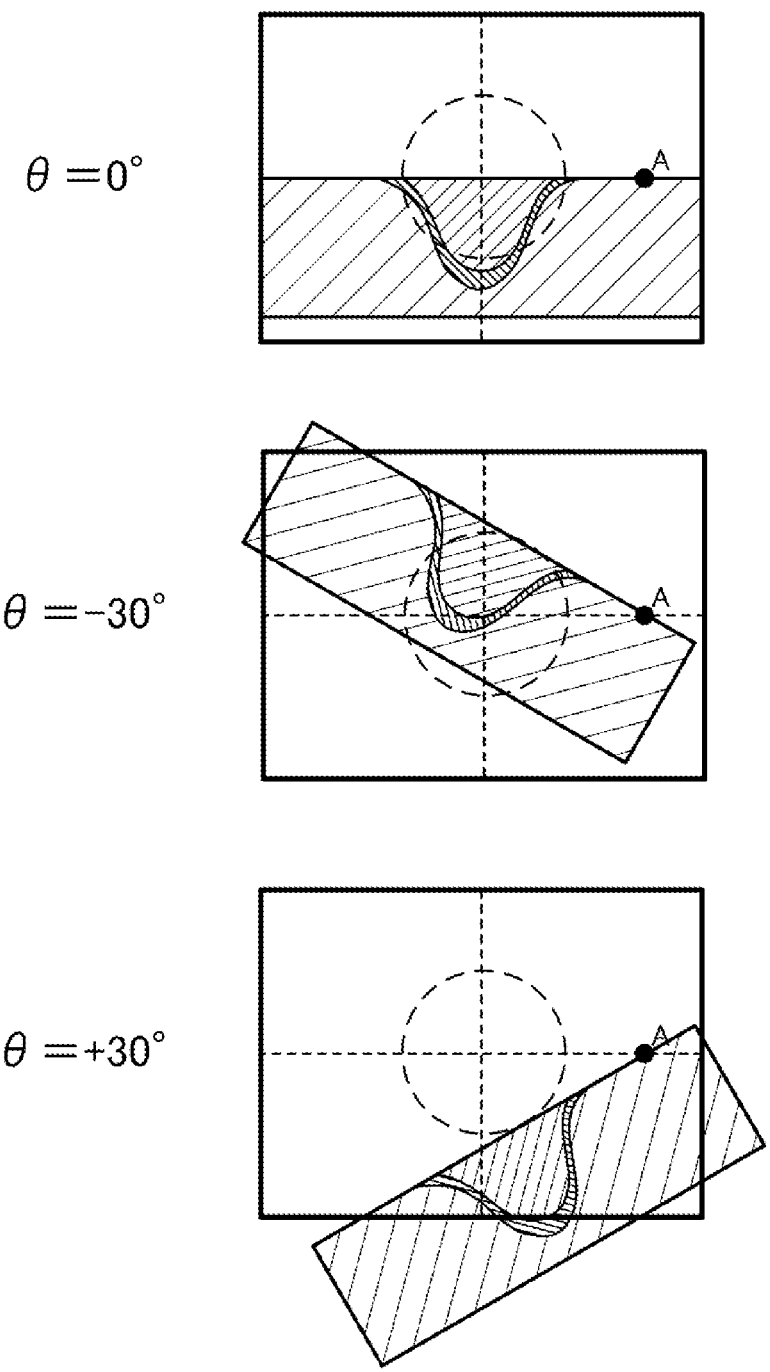
FIG. 11 shows other images from the milling observation camera when the swing axis and the beam impact point are not coincident.
Figure 12:
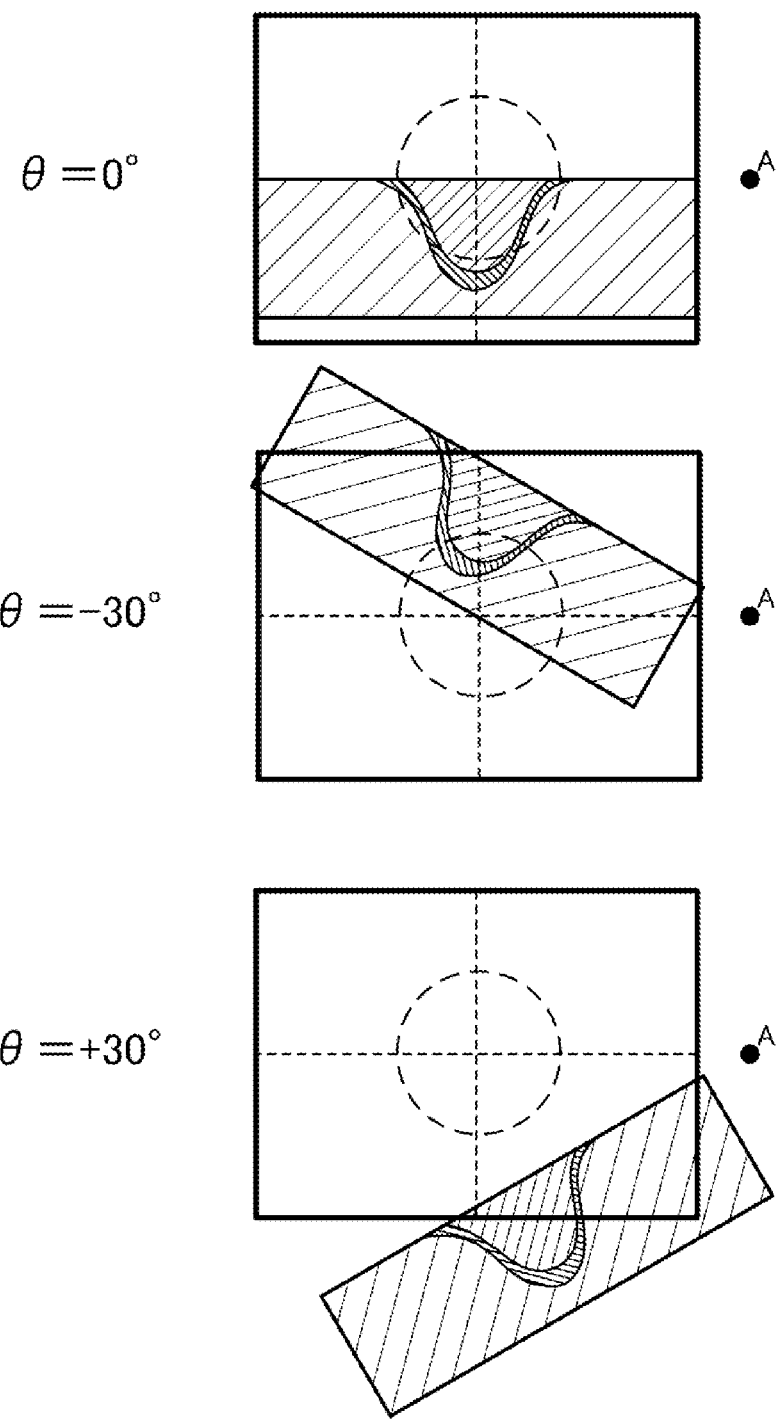
FIG. 12 shows further images from the milling observation camera when the swing axis and the beam impact point are not coincident.

FIG. 9 illustrates images taken by the milling observation camera 60 when the swing axis A and the impact point of the ion beam are coincident. FIGS. 10-12 illustrate images taken by the milling observation camera 60 when the swing axis A and the impact point of the ion beam are out of coincidence with one another. In FIG. 12, the amount of deviation between the swing axis A and impact point of the ion beam is greatest. In FIG. 10, the amount of deviation between the swing axis A and the impact point of the ion beam is smallest. FIGS. 9-12 illustrate cases where the tilt angle θ of the sample S is 0° (θ=0°), −30° (θ=−30°), and +30° (θ=+30°), respectively.

If the swing axis A and the impact point of the ion beam are coincident as shown in FIG. 9, the milling position is within the field of view of the milling observation camera 60, and the milling position can be checked with the milling observation camera 60. If the swing axis A and the impact point of the ion beam slightly deviate from each other and the distance between the swing axis A and the impact point of the ion beam does not exceed the tolerable range as shown in FIG. 10, the milling position is within the field of view of the milling observation camera 60 and can be checked with the observation camera 60.

However, if the positional deviation between the swing axis A and the impact point of the beam is so great that the distance between the swing axis A and the impact point of the beam exceeds the tolerable range as shown in FIGS. 11 and 12, the milling position will be out of the field of view of the milling observation camera 60 and so the milling position cannot be checked. Especially, where the timing of the end of a milling operation is judged automatically from the image from the observation camera 60 by image processing technology, if the milling position is out of the field of view, then it is impossible to correctly judge the timing of the end of the milling operation.

In the method associated with the present embodiment for adjusting the sample milling apparatus, the positional relationship between the observed field of view 2 of the positioning camera 50 and the swing axis A remains unchanged as described previously and, therefore, it is easy to make a decision as to whether the distance between the swing axis A and the impact point of the ion beam is within the tolerable range. Consequently, in the present embodiment, during milling, the milling position can be prevented from deviating from the field of view of the milling observation camera 60.

In the method associated with the present embodiment for adjusting the sample milling apparatus, during the step of bringing the impact point of the ion beam and the position of the displayed field of view 4 into coincidence, the display image I4 is extracted from the observation image I2 so as to bring the impact point of the beam into the center of the displayed field of view 4. Because the impact point of the beam is placed at the center of the displayed field of view 4, the ion beam can be made to impinge at the target milling position.

In the method associated with the present embodiment for adjusting the sample milling apparatus, the positioning camera 50 is so held that the swing axis A passes through the center of the field of view 2 under observation. Therefore, the positional relationship between the swing axis A and the positioning camera 50 remains unchanged. Consequently, the swing axis A passes through the center of the field of view 2 under observation at all times, and the swing axis A can be identified easily.

In the method associated with the present embodiment for adjusting the sample milling machine, the virtual swing axis VA that is an image indicative of the swing axis A is displayed superimposed on the display image I4. Therefore, the swing axis A can be visualized.

The sample milling apparatus 100 includes the ion source 10, the swinging mechanism 40 for swinging the sample S, the positioning camera 50 for bringing the target milling position on the sample into coincidence with the impact point of the ion beam, the display section 86 for displaying the image captured by the positioning camera 50, and the display controller 824 for extracting the display image I4 from the observation image I2 captured by the positioning camera 50 and displaying the extracted image on the display section 86. The display controller 824 modifies the displayed field of view 4 by modifying the position at which the display image I4 is extracted from the observation image I2. Therefore, in the sample milling apparatus 100, the impact point of the beam and the position of the displayed field of view 4 can be brought into coincidence by varying the position at which the display image I4 is extracted from the observation image I2.

The sample milling apparatus 100 includes the manual control section 84 for accepting a manipulation for modifying the displayed field of view 4. The display controller 824 modifies the displayed field of view 4 by modifying the position at which the display image I4 is extracted from the observation image I2 based on the manual control information from the manual control section 84. Therefore, in the sample milling apparatus 100, the impact point of the ion beam and the position of the displayed field of view 4 can be brought into coincidence by varying the position at which the display image I4 is extracted from the observation image I2.

In the sample milling apparatus 100, the display controller 824 operates such that the virtual swing axis VA being an image representing the swing axis A is superimposed on the display image I4 on the display section 86. Therefore, in the sample milling apparatus 100, the virtual swing axis VA can be visualized.

In the sample milling apparatus 100, the positioning camera 50 can be placed such that the sample can be observed. Under this condition, the positioning camera 50 is held so that the swing axis A passes through the center of the field of view 2 under observation. For this reason, in the sample milling apparatus 100, the positional relationship between the swing axis A and the positioning camera 50 remains unchanged. Accordingly, the swing axis A always passes through the center of the observed field of view 2 and thus the swing axis A can be identified easily.

4. Modified Embodiments

Modifications of the present embodiment for adjusting a sample milling apparatus are described next. In the following, only the differences with the above-described adjustment method associated with the present embodiment for a sample milling apparatus are described; a description of similarities is omitted.

4.1. First Modified Embodiment

In the foregoing embodiment, in the step S108 for making a decision as to whether the distance between the swing axis A and the impact point of the ion beam as shown in FIG. 4 exceeds the tolerable range, the distance between the virtual swing axis VA and the trace of impinging beam T is measured on the display image I4. In contrast, in a first modified embodiment, an image representing a range in which the distance between the swing axis A and the impact point of the beam exceeds the tolerable range is shown superimposed on the display image I4.

Figure 13:
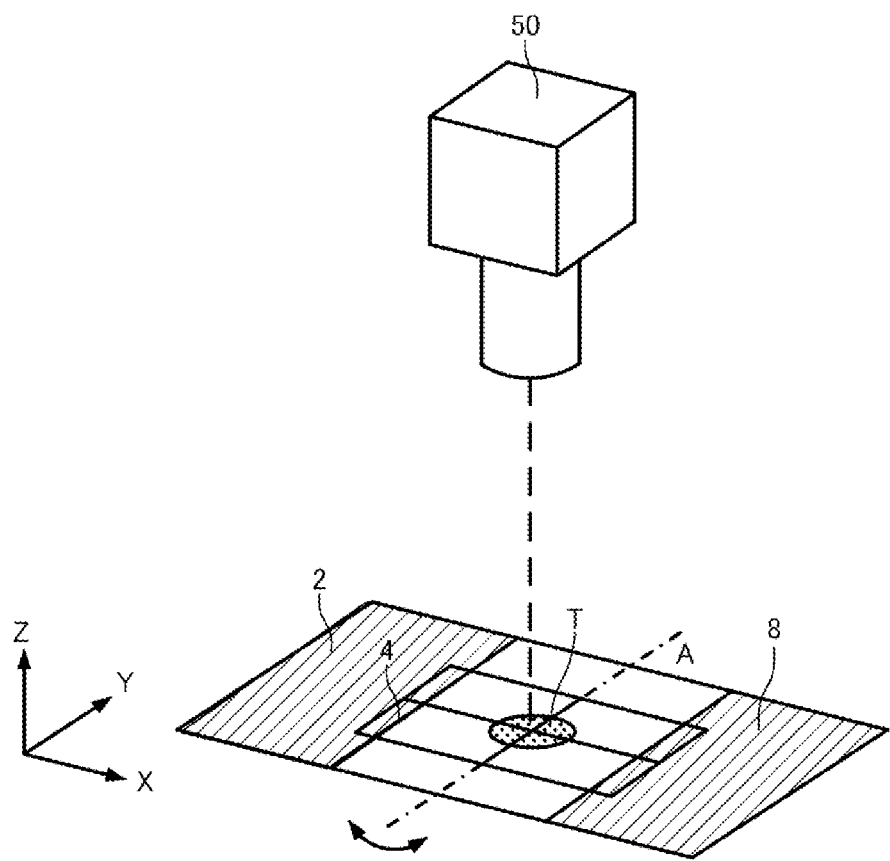
FIG. 13 illustrates an image indicating a range in which the distance between the swing axis and the beam impact point is in excess of a tolerable range.
Figure 14:
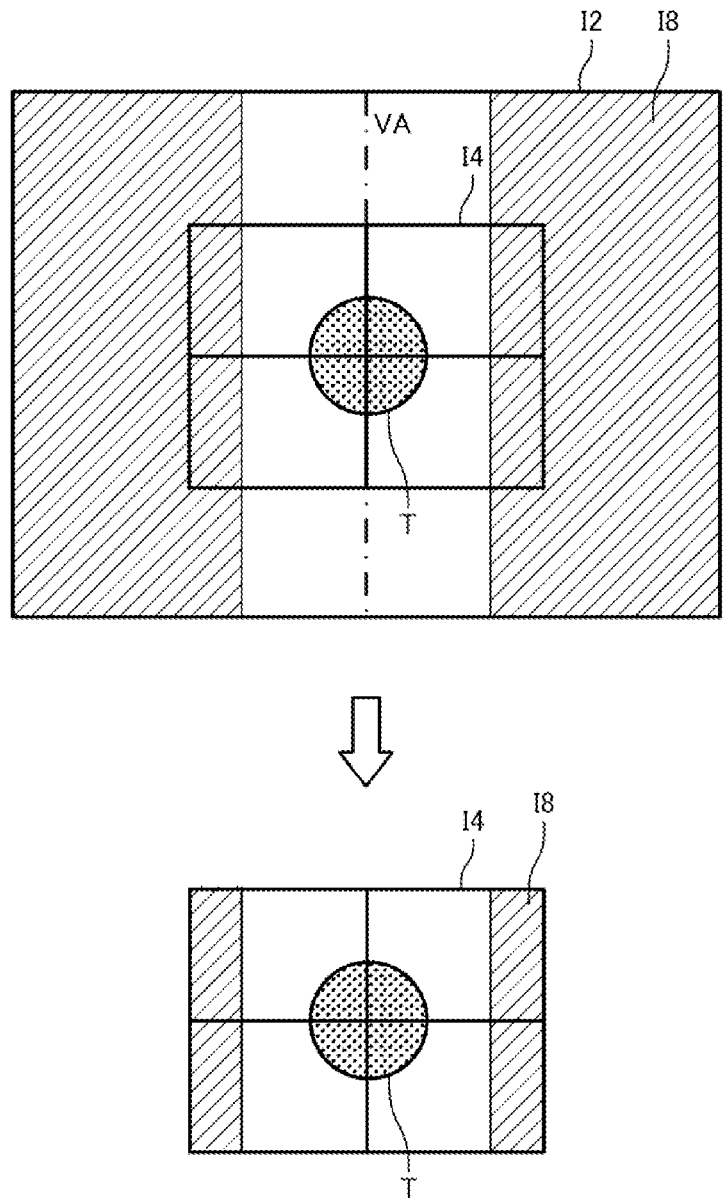
FIG. 14 illustrates other images indicating a range in which the distance between the swing axis and the beam impact point is in excess of the tolerable range.
Figure 15:
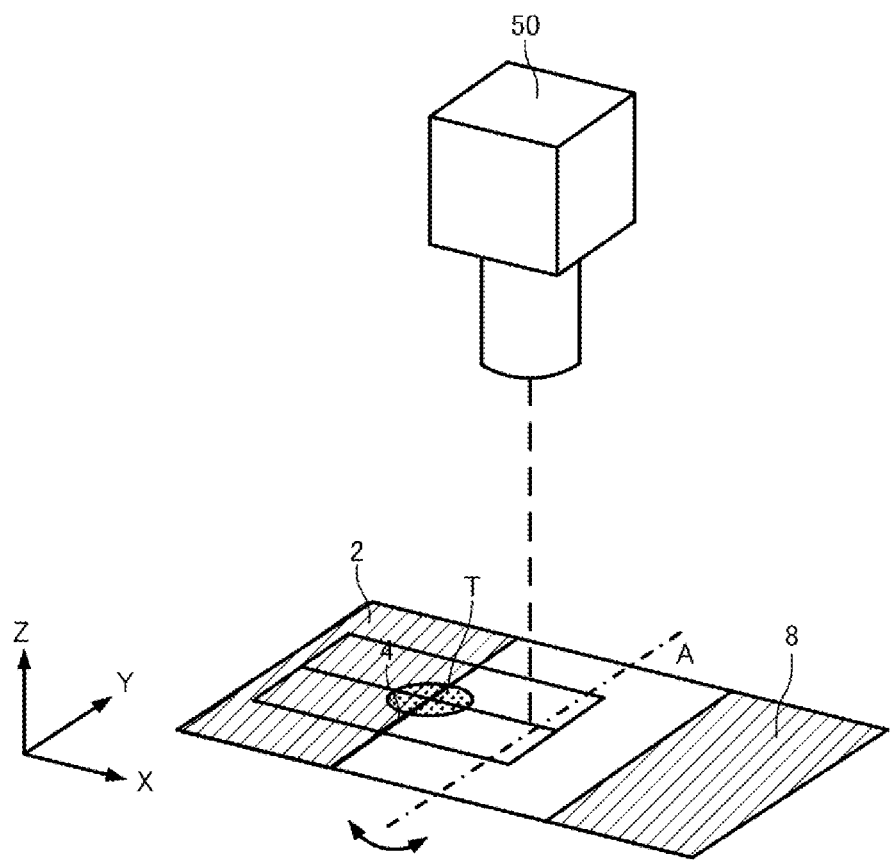
FIG. 15 illustrates a further image indicating a range in which the distance between the swing axis and the beam impact point is in excess of the tolerable range.
Figure 16:
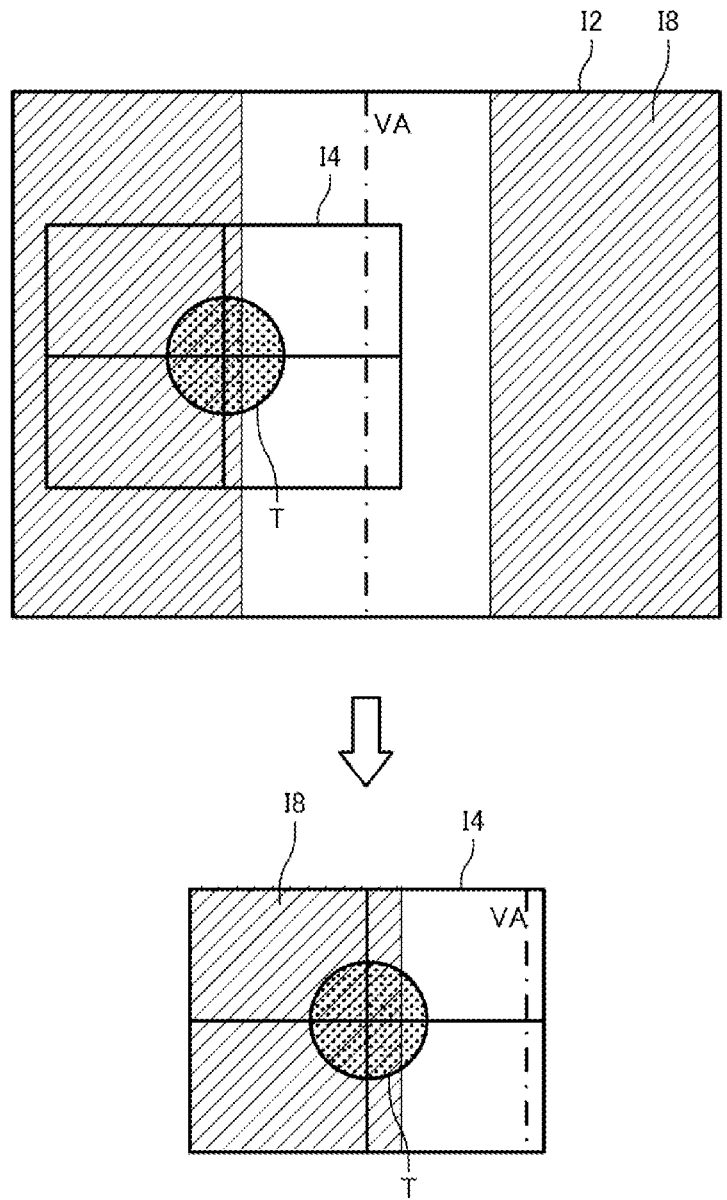
FIG. 16 illustrates still other images indicating a range in which the distance between the swing axis and the beam impact point is in excess of the tolerable range.

FIGS. 13-16 illustrate an image I8 representing a range in which the distance between the swing axis A and the impact point of the ion beam exceeds a tolerable range. FIGS. 13 and 15 illustrate the manner in which the trace T of the impinging ion beam is being observed with the positioning camera 50. FIG. 13 illustrates a case where the swing axis A and the impact point of the ion beam are coincident. FIG. 15 illustrates a case where the distance between the swing axis A and the impact point of the ion beam exceeds the tolerable range. FIG. 14 shows the observation image I2 from the positioning camera 50 shown in FIG. 13. FIG. 16 illustrates the observation image I2 from the positioning camera 50 shown in FIG. 15.

As shown in FIGS. 13 and 15, a range 8 in which the distance between the swing axis A and the impact point of the ion beam exceeds the tolerable range gives a range where the distance from the swing axis A is greater than a tolerable range in the X direction.

As shown in FIGS. 14 and 16, it is easy to make a decision as to whether the distance between the swing axis A and the impact point of the ion beam exceeds the tolerable range by drawing the image I8 in a region equivalent to the range 8 where the tolerable range on the observation image I2 is exceeded. The image I8 is hatched or shaded, for example. The image I8 may be so created that the range 8 in which the tolerable range is exceeded is identified by a distinct color or gray level.

If at least a part of the trace T of the impinging ion beam overlaps the image I8 as shown in FIG. 16, it can be determined that the distance between the swing axis A and the impact point of the ion beam is in excess of the tolerable range.

In the first modified embodiment, the display controller 824 causes the image I8 indicating the range 8 in which the distance between the swing axis A and the impact point of the ion beam exceeds the tolerable range to be displayed superimposed on the displayed field of view 4 shown on the display section 86. Therefore, it is easy to make a decision as to whether the distance between the swing axis A and the impact point of the beam exceeds the tolerable range.

In the example shown in FIGS. 14 and 16, the image I8 gives the wider range 8 in which the tolerable range is exceeded, the wider range 8 being hatched or otherwise marked. Representation of the image I8 is not restricted to this example. For example, the image I8 may give the wider range 8 in which the tolerable range is exceeded by hatching or shading the inside of the tolerable range.

4.2. Second Modified Embodiment

Figure 17:
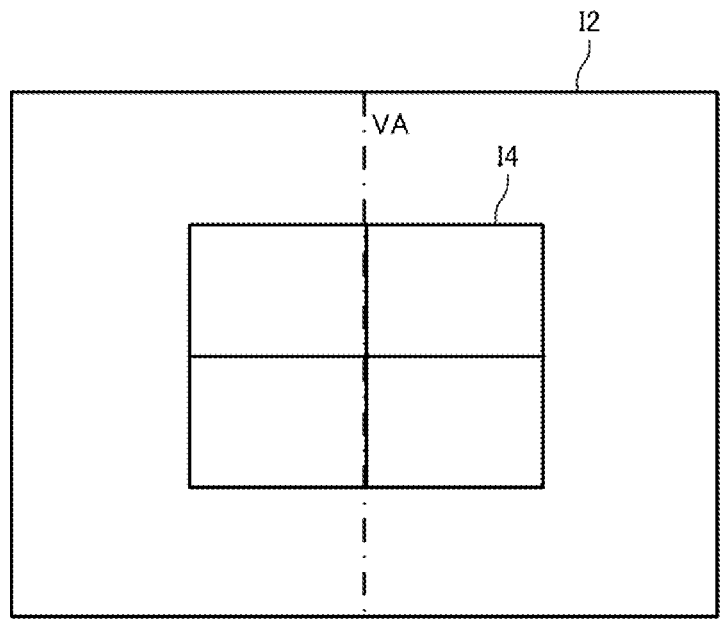
FIGS. 17, 18, and 19 are diagrams illustrating processing of a display controller.
Figure 18:
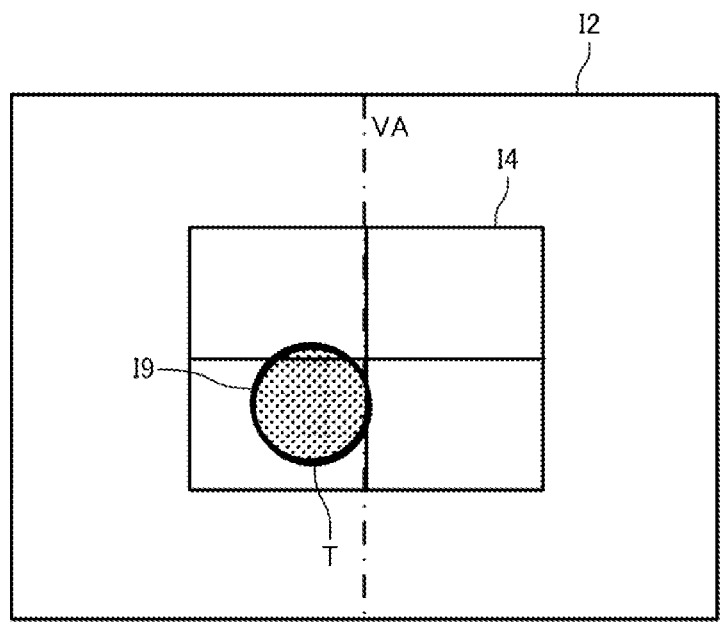
Figure 19:
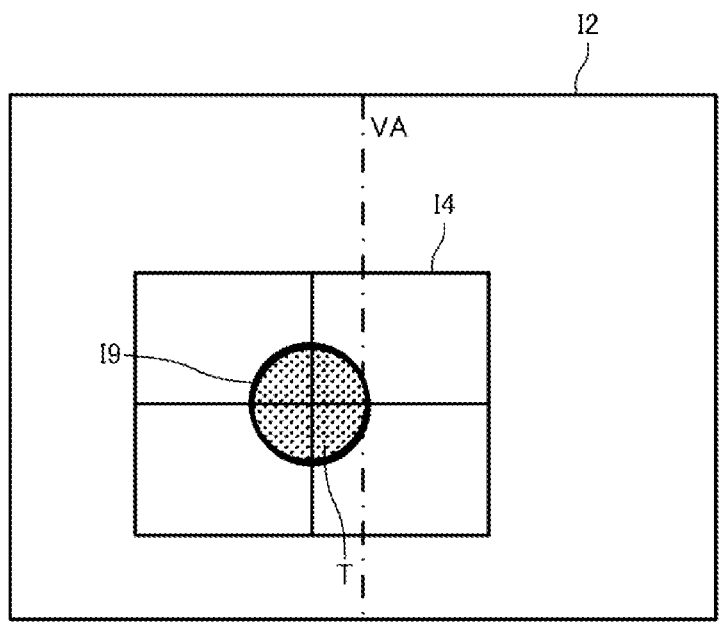

In a second modified embodiment, a decision step S108 of making a decision as to whether the distance between the impact point of the ion beam and the swing axis A exceeds a tolerable range, a positioning step S114 of bringing the impact point of the ion beam and the position of the displayed field of view 4 into coincidence, and a storing step S116 of storing positional information about the displayed field of view 4 are performed by the image processor 80. That is, in the sample milling apparatus 100, the decision step S108, positioning step S114, and storing step S116 are automatically performed. FIGS. 17-19 illustrate the processing steps of the display controller 824.

4.2.1. Decision Step S108

The display controller 824 recognizes the trace T of the impinging ion beam from the observation image I2 by image recognition technology and obtains information about the position and the size (contour) of the trace T. For example, the display controller 824 obtains the observation image I2 preceding the generation of the trace T of the impinging beam shown in FIG. 17 and compares the observation image I2 preceding the generation of the trace T and the observation image I2 succeeding the generation of the trace T shown in FIG. 6, thus deriving information about the position and size of the trace T of the beam. These kinds of information are stored in the storage section 88.

The display controller 824 displays an image I9 so as to be superimposed on the display image I4 based on the information about the position and size of the trace T of the impinging beam as shown in FIG. 18, the image I9 representing the impact point of the ion beam and the irradiated area. In the illustrated example, the image I9 is a circle of the size of the trace T of the impinging beam and drawn at the position of the trace T.

The display controller 824 makes a decision as to whether the distance between the swing axis A and the impact point of the ion beam exceeds the tolerable range, based on the information about the position of the trace T of the impinging beam.

If the decision is affirmative, indicating that the distance between the swing axis A and the impact point of the ion beam exceeds the tolerable range, the display controller 824 provides a notice that the position of the ion source 10 is to be adjusted. The notice is effected by displaying a message on the display section 86, for example.

If it is determined that the distance between the swing axis A and the impact point of the ion beam does not exceed the tolerable range, the display controller 824 automatically provides notice that the positioning step S114 will be performed. The notice is effected by displaying a message on the display section 86, for example.

The display controller 824 may effect automatic positioning only if permission of the automatic positioning is confirmed after a message is displayed on the display section 86 to prompt the user to confirm whether to effect automatic positioning.

As described above, in the second modified embodiment, the display controller 824 performs the steps of: obtaining the observation image I2 of the trace T of the impinging ion beam left on the test sample, the image being captured by the positioning camera 50; obtaining information about the position and size of the ion beam from the observation image I2; and displaying, on the display section 86, the image I9 representing the position and range of that portion of the sample which is impacted by the ion beam based on the information about the position and size. Therefore, when the target milling position on the sample is brought into coincidence with the impact point of the ion beam, the positioning can be effected while using the image I9 as an indicia. Consequently, the target milling position can be readily brought into coincidence with the impact point of the ion beam.

When the target milling position is brought into coincidence with the impact point of the ion beam, a part of the display image I4 displayed on the display section 86 can be enlarged. This permits the user to check the target milling position precisely. Even if a part of the display image I4 is shown in enlarged form, the image I9 is superimposed on the enlarged display image I4 and, therefore, the impact point of the ion beam can be easily checked. This permits the user to check the impact point of the ion beam with greater ease.

4.2.2. Positioning Step S114

As illustrated in FIG. 19, the display controller 824 extracts the display image I4 from the observation image I2 based on the information about the position and size of the trace T of the impinging beam and displays the display image I4 on the display section 86 such that the trace T is located, for example, in the center of the field of view of the display image I4.

In this way, the display controller 824 performs the steps of: obtaining information about the position of the trace T of the impinging ion beam, determining the position at which the display image I4 is extracted from the observation image I2 based on the information about the position of the trace T of the impinging beam, and bringing the impact point of the ion beam and the position of the displayed field of view 4 into coincidence. Consequently, in the sample milling apparatus 100, the impact point of the ion beam and the position of the displayed field of view 4 can be automatically brought into coincidence.

4.2.3. Storing Step S116

The information about the position on the observation image I2 at which the display image I4 is extracted is stored in the storage section 88 by the display controller 824. Also, the information about the position and size of the trace T of the impinging beam is stored in the storage section 88 by the display controller 824.

4.2.4. Effects

In the second modified embodiment, the display controller 824 performs the steps of: obtaining information about the position of the trace T of the impinging ion beam left on the sample; and extracting the display image I4 from the observation image I2 based on the information about the position of the trace T of the impinging beam and bringing the impact point of the ion beam and the position of the field of view of the display image I4 into coincidence. Therefore, in the second modified embodiment, the impact point of the ion beam and the position of the field of view of the display image I4 can be automatically brought into coincidence.

In the second modified embodiment, the display controller 824 performs the steps of obtaining information about the size of the trace T of the impinging beam and displaying, on the display section 86, the image I9 representing the position and range of that portion of the sample which is impacted by the ion beam based on the information about the position and size of the trace T of the impinging beam. Therefore, in the second modified embodiment, when the target milling position on the sample is brought into coincidence with the impact point of the ion beam, the positioning can be performed while using the image I9 as an indicia. Consequently, the target milling position can be easily brought into coincidence with the impact point of the ion beam.

4.3. Third Modified Embodiment

In the sample milling apparatus 100, the position and range (diameter) of that portion of the sample which is impacted by the ion beam vary according to the operative conditions of the ion source 10 under which the ion beam is emitted. The operative conditions include the accelerating voltage of the ion beam. As the accelerating voltage is increased, the ion beam has a smaller diameter. The operative conditions also include voltages applied to electrodes for focusing the ion beam. The diameter of the ion beam can be varied by changing the voltages applied to the electrodes.

In this way, the position and range of the portion of the sample impacted by the ion beam vary according to the operating conditions relating to emission of the ion beam. Therefore, in the above-described "4.2.1 storing step S116", information about the position and size of the trace T of the impinging beam is stored in the storage section 88 for each different set of operating conditions relating to emission of the ion beam. Consequently, the display controller 824 can display the image I9 according to the operating conditions relating to ion beam irradiation.

For example, where the target milling position on the sample is brought into coincidence with the impact point of the ion beam, if operating conditions for ion beam irradiation are set for the ion source 10, the display controller 824 reads information about the position and size of the trace T of the impinging beam which meet the set operating conditions from the storage section 88 and displays the image I9 on the display section 86 based on the read information.

As a result, if the target milling position is brought into coincidence with the position of the image I9, the target milling position can be brought into coincidence with the impact point of the ion beam. Consequently, this positional coincidence can be achieved easily.

4.4. Fourth Modified Embodiment

In the foregoing embodiment, the sample milling apparatus is the Cross Section Polisher (a trademark registered) for preparing a cross-sectional sample. Alternatively, the sample milling apparatus may also be the Ion Slicer (a trademark registered) for preparing a thin-film sample. The Ion Slicer is equipped with a shield belt for blocking an ion beam and thus the sample can be sliced into thin sections.

Note that the foregoing embodiments and modified embodiments are only exemplary and that the present invention is not restricted to them. For example, such embodiments and modified embodiments may be appropriately combined.

It is to be understood that the present invention is not restricted to the embodiments described above and that the invention can be practiced in variously modified forms. For example, the present invention embraces configurations substantially identical to the configurations described in the embodiments. What are meant by substantially identical configurations are configurations identical in functions, method, and results or in purposes and effects, for example. Furthermore, the present invention embraces configurations which are similar to those described in the foregoing embodiments except that nonessential portions have been replaced. In addition, the present invention embraces configurations which are identical in yielded advantageous effects or achieved purposes to the configurations described in the foregoing embodiments. Further, the present invention embraces configurations similar to those described in the foregoing embodiments except that a well-known technique is added.

What is claimed is:

1. A method of adjustment for use in a sample milling apparatus, the method comprising:
    observing, with a positioning camera of the sample milling apparatus, a trace of an impinging ion beam emitted from an ion source of the sample milling apparatus at a sample, while the positioning camera is positionally held relative to a swing axis of a swinging mechanism of the sample milling apparatus that is configured to swing the sample, to obtain an observation image; and
    extracting a display image to be displayed on a display section of the sample milling apparatus from the observation image based on a position of the trace of the impinging ion beam to thereby bring an impact point of the impinging ion beam and a position of a field of view of the display image into coincidence with each other.

2. A method of adjustment as set forth in claim 1, wherein during said step of bringing the impact point of the impinging ion beam and the position of the field of view of the display image into coincidence, said display image is extracted from said observation image such that the impact point of the impinging ion beam is located at a center of the field of view of the display image.

3. A method of adjustment as set forth in claim 1, wherein said positioning camera is held such that said swing axis passes through a center of the field of view of said observation image.

4. A method of adjustment as set forth in claim 3, wherein an image representing said swing axis is shown on said display section so as to be superimposed on said display image.

5. A method of adjustment as set forth in claim 1, wherein an image representing a range where a distance between said swing axis and said impact point of the impinging ion beam exceeds a tolerable range is superimposed on said display image being displayed on said display section.

6. A method of adjustment as set forth in claim 1, wherein an image indicating a position and range of a part of the sample which is impacted by said impinging ion beam is superimposed on said display image being displayed on said display section.

7. A sample milling apparatus comprising:
    an ion source for emitting an impinging ion beam at a sample;
    a swinging mechanism for swinging the sample;
    a positioning camera for bringing a target milling position on the sample into coincidence with an impact point of the impinging ion beam;
    a display section for displaying an image captured by the positioning camera; and
    a display controller comprising a hardware processor, the display controller configured to extract a display image from an observation image captured by the positioning camera and display the display image on the display section,
    wherein the display controller is further configured to vary a field of view of the display image by varying a position at which the display image is extracted from the observation image.

8. A sample milling apparatus as set forth in claim 7, further comprising a manual control section for accepting a manipulative action for varying the field of view of said display image, and wherein said display controller is configured to vary the field of view of the display image by varying the position at which the display image is extracted from said observation image based on manual control information from the manual control section.

9. A sample milling apparatus as set forth in claim 7, wherein said display controller is further configured to:
    obtain information about a position of a trace of the impinging ion beam left on the sample; and
    extract said display image from said observation image based on the information about the position of said trace and bringing the impact point of the impinging ion beam and the position of the field of view of the display image into coincidence with each other.

10. A sample milling apparatus as set forth in claim 9, wherein said display controller is further configured to:
    obtain information about a size of said trace of the impinging ion beam; and
    cause an image representing a position and range of a part of the sample which is impacted by said impinging ion beam to be displayed on said display section based on the information about the position and the size of the trace of the impinging ion beam.

11. A sample milling apparatus as set forth in claim 10, further comprising a storage section in which information about the position and the size of said trace of the impinging ion beam is stored for each different set of operating conditions of said ion source for ion beam irradiation.

12. A sample milling apparatus as set forth in claim 7, wherein said display controller is further configured to display an image representing a swing axis of said swinging mechanism such that the image representing the swing axis is superimposed on said display image being displayed on said display section.

13. A sample milling apparatus as set forth in claim 7, wherein said display controller is further configured to display an image representing a range in which a distance between a swing axis of said swinging mechanism and the impact point of the impinging ion beam exceeds a tolerable range such that the image representing the range is superimposed on said display image being displayed on the display section.

14. A sample milling apparatus as set forth in claim 7, wherein said positioning camera is further configured to be placed in an observable mode where the sample is observable by the positioning camera, and wherein, when the positioning camera is in the observable mode, the positioning camera is held such that a swing axis of said swinging mechanism passes through a center of the field of view of said observation image.

\* \* \* \* \*